(12) United States Patent
Akebono et al.

(10) Patent No.: US 9,395,395 B2
(45) Date of Patent: Jul. 19, 2016

(54) VOLTAGE DETECTOR, ELECTRONIC DEVICE, AND CONTROL METHOD OF VOLTAGE DETECTOR

(71) Applicant: Sony Corporation, Tokyo (JP)

(72) Inventors: Sachio Akebono, Kanagawa (JP); Kiyoshi Makigawa, Kanagawa (JP); Daisuke Hirono, Kanagawa (JP); Moonjae Jeong, Kanagawa (JP); Taiki Iguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 222 days.

(21) Appl. No.: 14/301,119

(22) Filed: Jun. 10, 2014

(65) Prior Publication Data

US 2015/0002179 A1    Jan. 1, 2015

(30) Foreign Application Priority Data

Jun. 28, 2013  (JP) .................................. 2013-136139

(51) Int. Cl.
*G01R 19/165* (2006.01)
*G01R 31/40* (2014.01)
*G01R 19/00* (2006.01)

(52) U.S. Cl.
CPC ........ *G01R 19/16538* (2013.01); *G01R 19/165* (2013.01); *G01R 19/0084* (2013.01); *G01R 31/40* (2013.01)

(58) Field of Classification Search
CPC .............. G01R 19/00; G01R 19/0084; G01R 19/0092; G01R 19/16538; G01R 19/16547; G01R 19/16566; G01R 19/16571; G01R 19/16576; G01R 31/40; G01R 19/165; G01R 19/16504
USPC ........... 324/713, 691, 649, 600, 76.11; 702/1, 702/57, 64
See application file for complete search history.

(56) References Cited

U.S. PATENT DOCUMENTS

| | | | | |
|---|---|---|---|---|
| 6,833,715 B2* | 12/2004 | Sakaguchi | ............. | G09G 3/006 324/713 |
| 8,836,352 B2* | 9/2014 | Shearon | ............. | H03K 19/1732 324/627 |
| 2002/0101263 A1* | 8/2002 | Kinoshita | ............. | H03K 17/223 327/58 |

(Continued)

OTHER PUBLICATIONS

Seiko Instruments Inc. 2001-2011, "S-808xxC Series" p. 2 to 24, Japanese and English translation Search on Apr. 26, 2013 Internet <URL:http://datasheet.sii=ic.com/jp/voltage_detector/S808xxC_J.PDF>.

*Primary Examiner* — Hoai-An D Nguyen
(74) *Attorney, Agent, or Firm* — Michael Best and Friedrich LLP

(57) ABSTRACT

There is provided a voltage detector including a reference voltage generator that generates a constant reference voltage when a power supply voltage is higher than a predetermined threshold voltage, and a detector that, when the power supply voltage exceeds a voltage that is higher than the threshold voltage by a predetermined potential, detects whether the power supply voltage is higher than a defined voltage based on the reference voltage and outputs a detection result.

8 Claims, 13 Drawing Sheets

(56) References Cited

U.S. PATENT DOCUMENTS

| | | | | |
|---|---|---|---|---|
| 2002/0180497 A1* | 12/2002 | Kim | | G06F 1/24 327/143 |
| 2006/0103480 A1* | 5/2006 | Moon | | G11C 16/225 331/74 |
| 2009/0037755 A1* | 2/2009 | Nakano | | G06F 1/3203 713/322 |
| 2010/0277142 A1* | 11/2010 | Tan | | H02M 7/53803 323/268 |
| 2011/0148395 A1* | 6/2011 | Chiang | | G01R 19/0084 324/104 |
| 2012/0062240 A1* | 3/2012 | Nishijima | | G01R 19/0092 324/600 |
| 2012/0262148 A1* | 10/2012 | Tu | | G01R 19/16552 324/76.11 |
| 2014/0184184 A1* | 7/2014 | Yajima | | G01R 19/165 323/274 |
| 2015/0005976 A1* | 1/2015 | Akebono | | G05B 15/02 700/297 |

* cited by examiner

FIG. 5
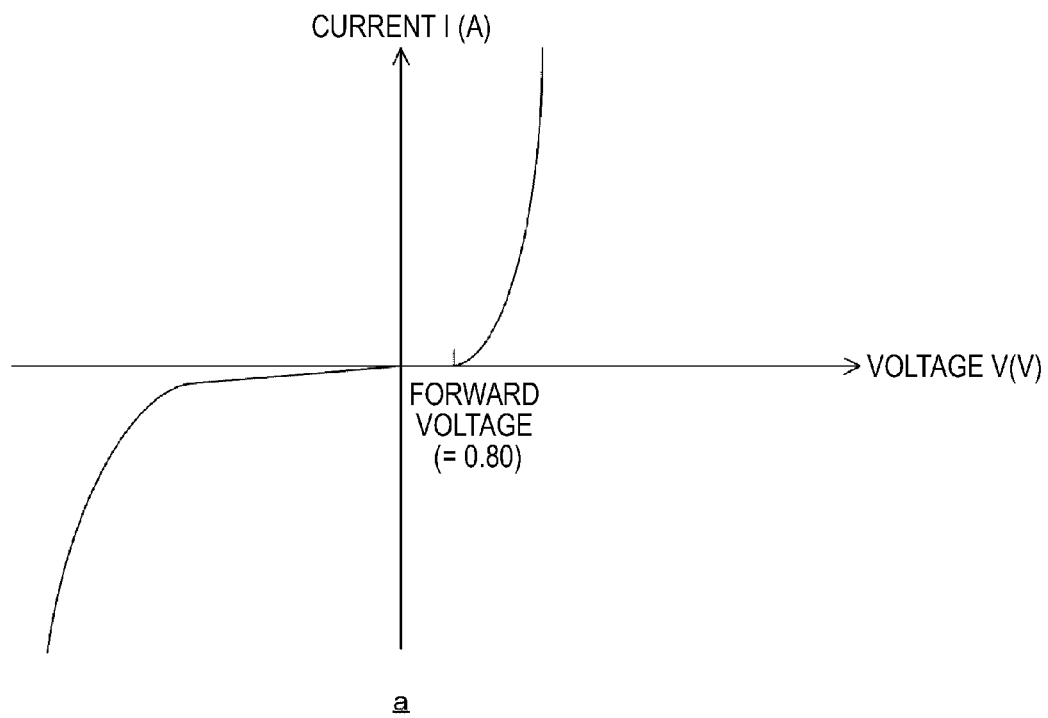
a
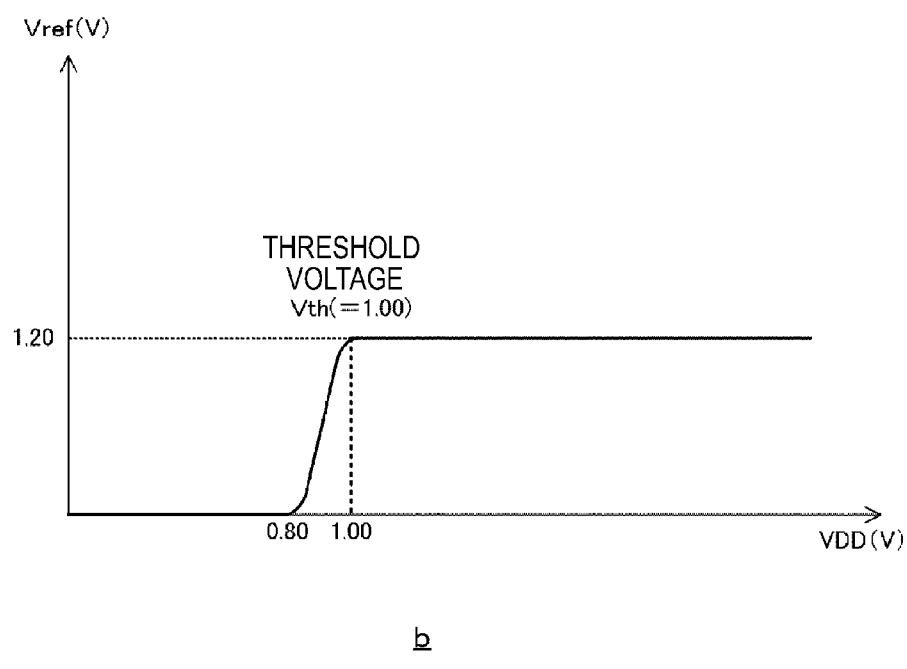
b

FIG. 7
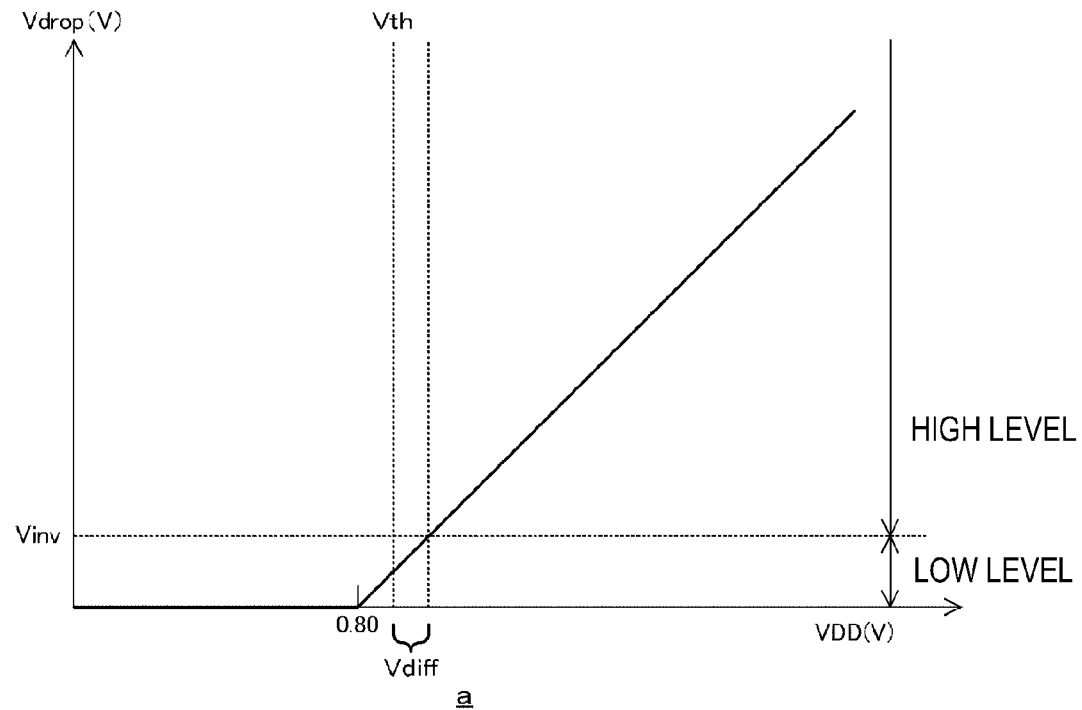
a
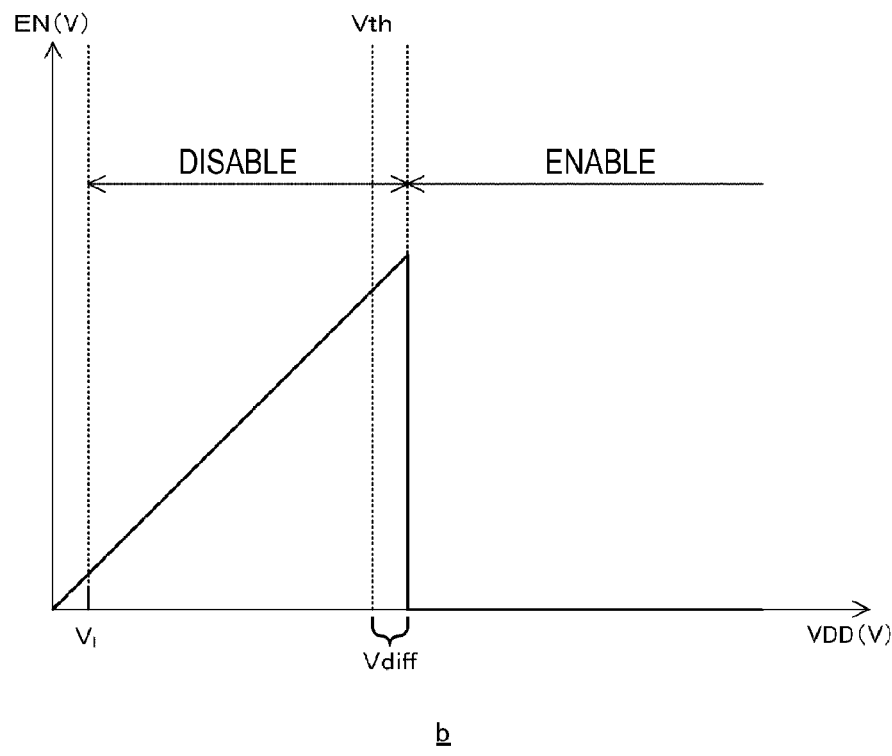
b

FIG. 10

| | CONTROL SIGNAL EN | REFERENCE VOLTAGE Vref | DETECTION TARGET VOLTAGE Vdet | DETECTION RESULT Vout |
|---|---|---|---|---|
| VDD ↓ Vth (1.00V) — Vth+Vdiff (1.20V) — Vdef (1.45V) — ↓ | DISABLE (VDD≦Vth+Vdiff) | 0.00V (VDD≦Vth) | — (DISABLING) | LOW LEVEL (VDD≦Vdef) |
| | | 1.20V (VDD>Vth) | — (DISABLING) | LOW LEVEL (VDD≦Vdef) |
| | ENABLE (VDD>Vth+Vdiff) | 1.20V (VDD>Vth) | Vdet≦Vref (VDD≦Vdef) | LOW LEVEL (VDD≦Vdef) |
| | | | Vdet>Vref (VDD>Vdef) | HIGH LEVEL (VDD>Vdef) |

VOLTAGE DETECTOR, ELECTRONIC DEVICE, AND CONTROL METHOD OF VOLTAGE DETECTOR

CROSS REFERENCE TO RELATED APPLICATIONS

This application claims the benefit of Japanese Priority Patent Application JP 2013-136139 filed Jun. 28, 2013, the entire contents of which are incorporated herein by reference.

BACKGROUND

The present technology relates to a voltage detector, an electronic device, and a control method of the voltage detector. In particular, the present technology relates to a voltage detector that detects a power supply voltage of a defined voltage or lower, an electronic device, and a control method of the voltage detector.

In recent years, developments in miniaturization and power saving of electronic devices are remarkable and each device in an electronic device is frequently demanded to perform a correct operation at low voltage. To guarantee an operation at low voltage, a voltage detector that detects whether a power supply voltage VDD is higher than a constant defined voltage is used in electronic devices. For example, a voltage detector including a reference voltage generator circuit that generates a constant reference voltage Vref and a comparator is proposed (see, for example, "S-808xxC series", p2-p24, [online], Seiko Instruments Inc., [searched on Apr. 26, 2013], Internet <URL: http://datasheet.sii-ic.com/jp/voltage_detector/S808xxC_J.pdf>). The comparator divides the power supply voltage VDD in the ratio of the reference voltage Vref to the defined voltage and compares the divided voltage and the reference voltage Vref to detect whether the power supply voltage VDD is higher than the defined voltage.

By switching processing of the power supply and backup processing being performed by electronic devices based on the detection result, a correct operation of electronic devices at low voltage that is lower than the defined voltage is guaranteed.

SUMMARY

However, according to the conventional technology described above, whether the power supply voltage VDD is higher than the constant defined voltage may not be correctly detectable. The above reference voltage generator circuit is realized by devices such as a regulator and a band gap reference circuit and if the power supply voltage VDD is lower than the lowest voltage Vth at which the devices and the circuit operate correctly, it is difficult to generate the constant reference voltage Vref. If the constant reference voltage Vref is not generated, the comparator may not be able to correctly detect whether the power supply voltage is higher than the defined voltage. If whether the power supply voltage VDD is higher than the defined voltage is not correctly detected, electronic devices may malfunction.

The present technology is created in view of the above situation and it is desirable to correctly detect whether the power supply voltage is higher than a constant voltage.

According to an embodiment of the present disclosure, there is provided a voltage detector including a reference voltage generator that generates a constant reference voltage when a power supply voltage is higher than a predetermined threshold voltage, and a detector that, when the power supply voltage exceeds a voltage that is higher than the threshold voltage by a predetermined potential, detects whether the power supply voltage is higher than a defined voltage based on the reference voltage and outputs a detection result. Accordingly, an operation of the constant reference voltage being generated when the power supply voltage is higher than the threshold voltage and whether the power supply voltage is higher than the defined voltage being detected based on the reference voltage when the power supply voltage exceeds the voltage that is higher than the threshold voltage by the predetermined potential is achieved.

According to an embodiment of the present disclosure, the voltage detector may further include a detection controller that, when the power supply voltage exceeds the voltage that is higher than the threshold voltage by the predetermined potential, supplies a control signal to enable a detection operation of the detector to the detector. When the detection operation is enabled by the control signal, the detector detects whether the power supply voltage is higher than the defined voltage based on the reference voltage and outputs the detection result. Accordingly, an operation of the detection operation of the detector being enabled by the control signal when the power supply voltage exceeds the voltage that is higher than the threshold voltage by the predetermined potential is achieved.

According to an embodiment of the present disclosure, the detector may include a voltage dividing unit that divides the power supply voltage in accordance with a ratio of the reference voltage to the defined voltage, and a comparison unit that, when the detection operation is enabled by the control signal, compares the divided power supply voltage and the reference voltage and outputs a result of the comparison as the detection result. Accordingly, an operation of the power supply voltage divided in the ratio of the reference voltage to the defined voltage and the reference voltage being compared is achieved.

According to an embodiment of the present disclosure, the detection controller may include a voltage dropping unit that causes the power supply voltage to drop until a potential difference between the power supply voltage before being caused to drop and the power supply voltage after being caused to drop falls to the threshold voltage, and a control signal generator that, when the power supply voltage caused to drop is higher than the predetermined potential, outputs the control signal to enable the detection operation. Accordingly, an operation of the power supply voltage being dropped and when the dropped power supply voltage is higher than the predetermined potential, the detector being enabled is achieved.

According to an embodiment of the present disclosure, the voltage dropping unit may cause the power supply voltage to drop by a diode and impedance connected in series to the power supply voltage. Accordingly, an operation of the power supply voltage being dropped by the diode and impedance is achieved.

According to an embodiment of the present disclosure, the voltage dropping unit may cause the power supply voltage to drop by a transistor and impedance connected in series to the power supply voltage. Accordingly, an operation of the power supply voltage being dropped by the transistor and impedance is achieved.

According to an embodiment of the present disclosure, there is provided an electronic device including a reference voltage generator that generates a constant reference voltage when a power supply voltage is higher than a predetermined threshold voltage, a detector that, when the power supply voltage exceeds a voltage that is higher than the threshold voltage by a predetermined potential, detects whether the power supply voltage is higher than a defined voltage based on the reference voltage and outputs a detection result, and a processing unit that performs predetermined processing based on the detection result. Accordingly, an operation of the constant reference voltage being generated when the power supply voltage is higher than the threshold voltage and whether the power supply voltage is higher than the defined voltage being detected based on the reference voltage when the power supply voltage exceeds the voltage that is higher than the threshold voltage by the predetermined potential is achieved.

According to the present technology, an excellent effect of being able to correctly detect whether a power supply voltage is higher than a constant voltage can be achieved.

BRIEF DESCRIPTION OF THE DRAWINGS

FIG. 5 shows graphs showing V-I characteristics of a diode according to the first embodiment and a relationship between a power supply voltage and a reference voltage;

FIG. 7 shows graphs showing an example of the relationship between an input voltage, a control signal, and the power supply voltage according to the first embodiment;

FIG. 10 is a diagram showing an example of the operation of the comparison unit according to the first embodiment;

DETAILED DESCRIPTION OF THE EMBODIMENTS

Forms (hereinafter, called embodiments) to carry out the present technology will be described below. The description will be provided in the order shown below:

1. First embodiment (example in which the detection operation is enabled when the power supply voltage caused to drop by a diode is higher than a predetermined potential)

2. Second embodiment (example in which the detection operation is enabled when the power supply voltage caused to drop by a transistor is higher than a predetermined potential)

1. First Embodiment

Configuration Example of the Electronic Device

Figure 1:
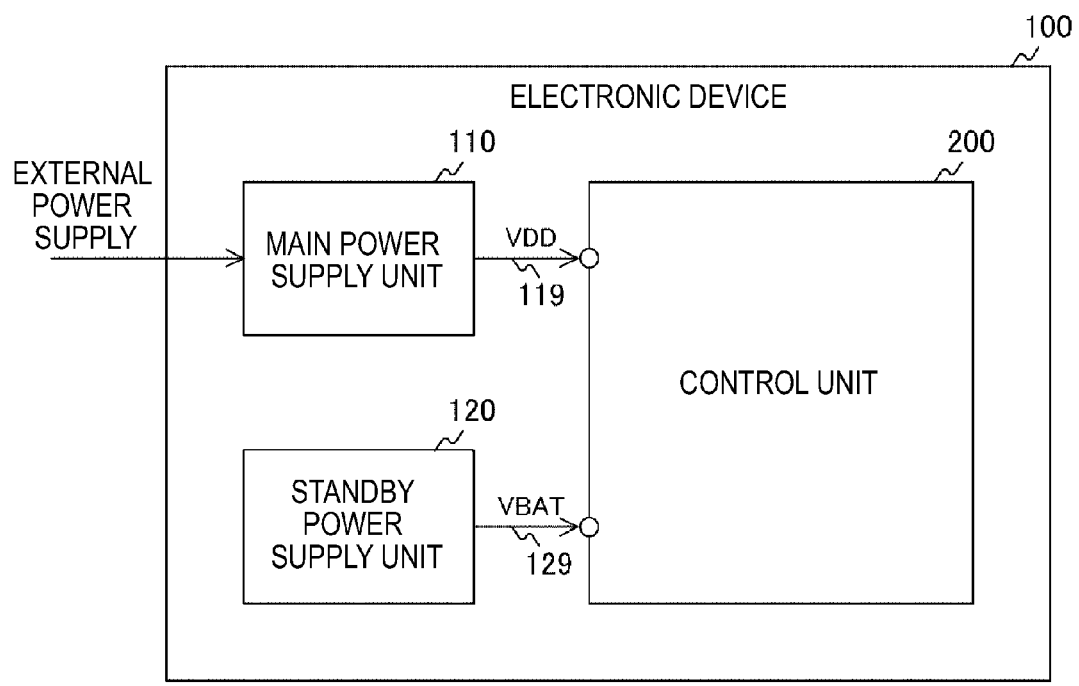
FIG. 1 is a block diagram showing a configuration example of an electronic device according to a first embodiment.

FIG. 1 is a block diagram showing a configuration example of an electronic device 100 according to the first embodiment as the embodiment. The electronic device 100 includes a main power supply unit 110, a standby power supply unit 120, and a control unit 200.

The main power supply unit 110 supplies a main power supply. For example, the main power supply unit 110 receives an external power supply of AC, converts the external power supply into DC, and supplies the power supply of DC to the control unit 200 via a signal line 119 as the main power supply.

The standby power supply unit 120 supplies a standby power supply. The standby power supply is a power supply supplied instead of the main power supply when the power supply voltage VDD of the main power supply falls to a defined voltage Vdef or below. The defined voltage Vdef is the lowest operating voltage at which, for example, the electronic device 100 is guaranteed to operate correctly. The standby power supply unit 120 includes, for example, a secondary battery and supplies electric power stored in the secondary battery to the control unit 200 via a signal line 129 as a standby power supply.

The control unit 200 controls the whole electronic device 100. The control unit 200 detects whether the power supply voltage VDD of the main power supply is higher than the defined voltage Vdef. If the power supply voltage VDD falls to the defined voltage Vdef or below, the control unit 200 performs predetermined processing such as switching processing of the supply source of the power supply and backup processing of specific data.

[Configuration Example of the Control Unit]

Figure 2:
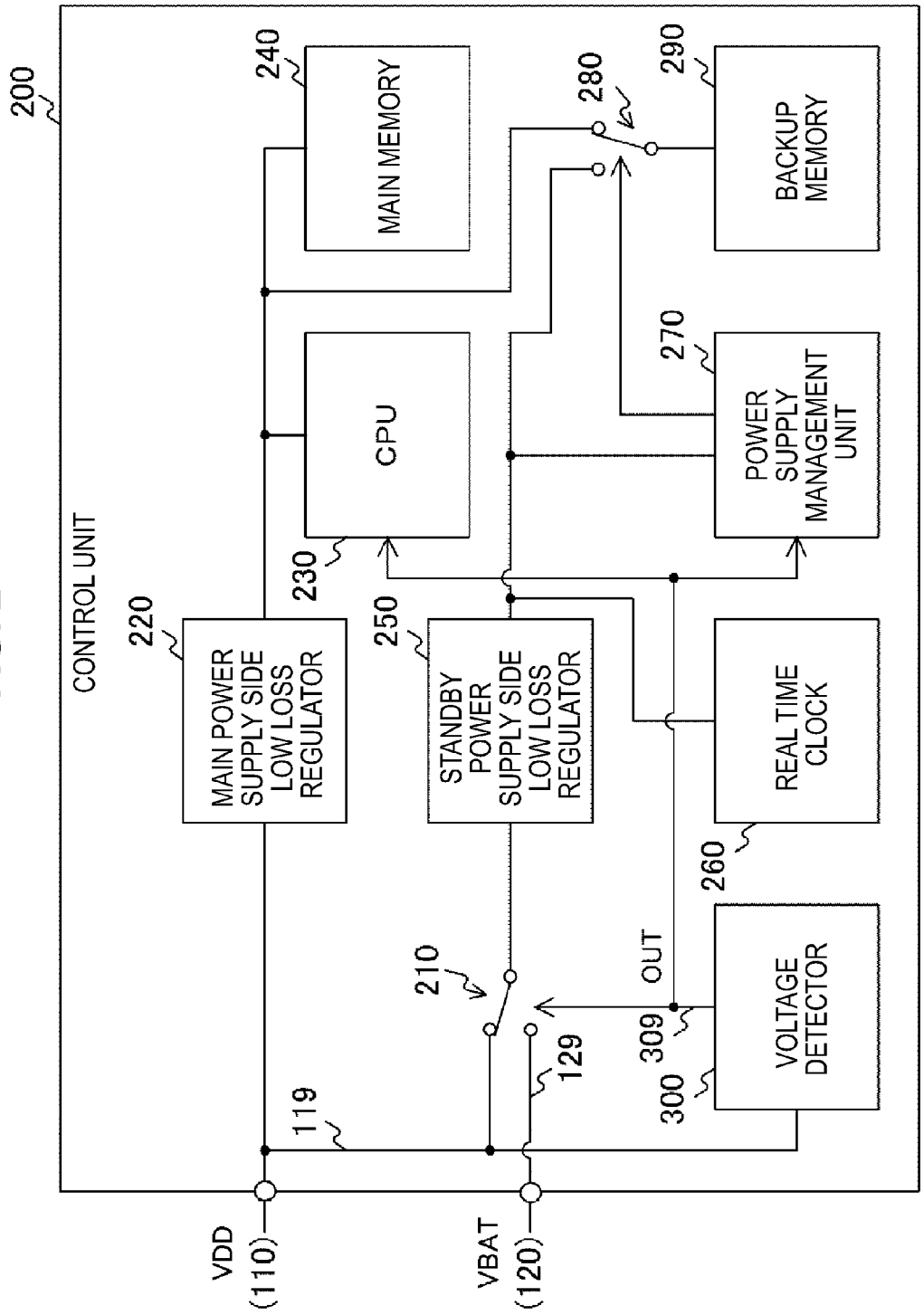
FIG. 2 is a block diagram showing a configuration example of a control unit according to the first embodiment.

FIG. 2 is a block diagram showing a configuration example of the control unit 200 according to the first embodiment. The control unit 200 includes a power supply changeover switch 210, a voltage detector 300, a main power supply side low loss regulator 220, a CPU (Central Processing Unit) 230, and a main memory 240. The control unit 200 also includes a standby power supply side low loss regulator 250, a real time clock 260, a power supply management unit 270, a power supply changeover switch 280, and a backup memory 290.

The power supply changeover switch 210 switches the supply source of the power supply. The power supply changeover switch 210 includes two input terminals and one output terminal. One of the two input terminals is connected to the main power supply unit 110 via the signal line 119 and the other is connected to the standby power supply unit 120 via the signal line 129. The output terminal of the power supply changeover switch 210 is connected to the standby power supply side low loss regulator 250. The power supply changeover switch 210 switches the supply source of the power supply to the standby power supply side low loss regulator 250 according to a detection result OUT from the voltage detector 300.

The detection result OUT is a signal showing a result of detecting whether the power supply voltage VDD is higher than the defined voltage Vdef. For example, a high level is set to the detection result OUT when the power supply voltage VDD is higher than the defined voltage Vdef and otherwise, a low level is set. The power supply changeover switch 210 switches the supply source of the power supply to the main power supply when the detection result OUT is the high level and to the standby power supply when the detection result OUT is the low level.

The voltage detector 300 detects whether the power supply voltage VDD is higher than the defined voltage Vdef. The voltage detector 300 supplies a result of detection to the power supply changeover switch 210, the CPU 230, and the power supply management unit 270 via a signal line 309 as the detection result OUT.

The main power supply side low loss regulator 220 controls the output voltage to a constant level based on the main power supply. The main power supply side low loss regulator 220 generates a constant output voltage from the main power supply and supplies the constant output voltage to the CPU 230, the main memory 240, and the power supply changeover switch 280.

The CPU 230 controls the whole control unit 200. The CPU 230 receives the detection result OUT from the voltage detector 300. When the power supply voltage VDD is equal to the defined voltage Vdef or below, the CPU 230 performs predetermined processing such as backup processing of data and reset processing. In backup processing, the CPU 230 causes the backup memory 290 to store data intended for backup. A circuit including the power supply changeover switch 210 and the CPU 230 is an example of a processing unit described in claims.

The main memory 240 is used as a work area to temporarily store programs executed by the CPU 230 or data necessary for processing. An area in which programs are stored may be configured by a flash ROM (Read Only Memory) and an area for primarily storing data necessary for processing may be configured by a RAM (Random Access Memory).

The standby power supply side low loss regulator 250 controls the output voltage to a constant level based on the main power supply or the standby power supply. The standby power supply side low loss regulator 250 generates a constant output voltage from the standby power supply and supplies the constant output voltage to the real time clock 260, the power supply management unit 270, and the power supply changeover switch 280.

The real time clock 260 is driven when the main power supply or the standby power supply is supplied to generate current time data showing the current time.

The power supply management unit 270 controls the supply voltage to a device inside the control unit 200. The power supply management unit 270 receives the detection result OUT from the voltage detector 300. When the power supply voltage VDD is equal to the defined voltage Vdef or below, the power supply management unit 270 controls the power supply changeover switch 280 to cause switching of the supply source of the power supply to the backup memory 290 from the main power supply to the standby power supply.

The power supply changeover switch 280 switches the supply source of the power supply. The power supply changeover switch 280 includes two input terminals and one output terminal. One of the two input terminals is connected to the main power supply side low loss regulator 220 and the other is connected to the standby power supply side low loss regulator 250. The output terminal of the power supply changeover switch 280 is connected to the backup memory 290. The power supply changeover switch 210 switches the supply source of the power supply to the backup memory 290 according to the control of the power supply management unit 270.

The backup memory 290 stores data intended for backup.

[Configuration Example of the Voltage Detector]

Figure 3:
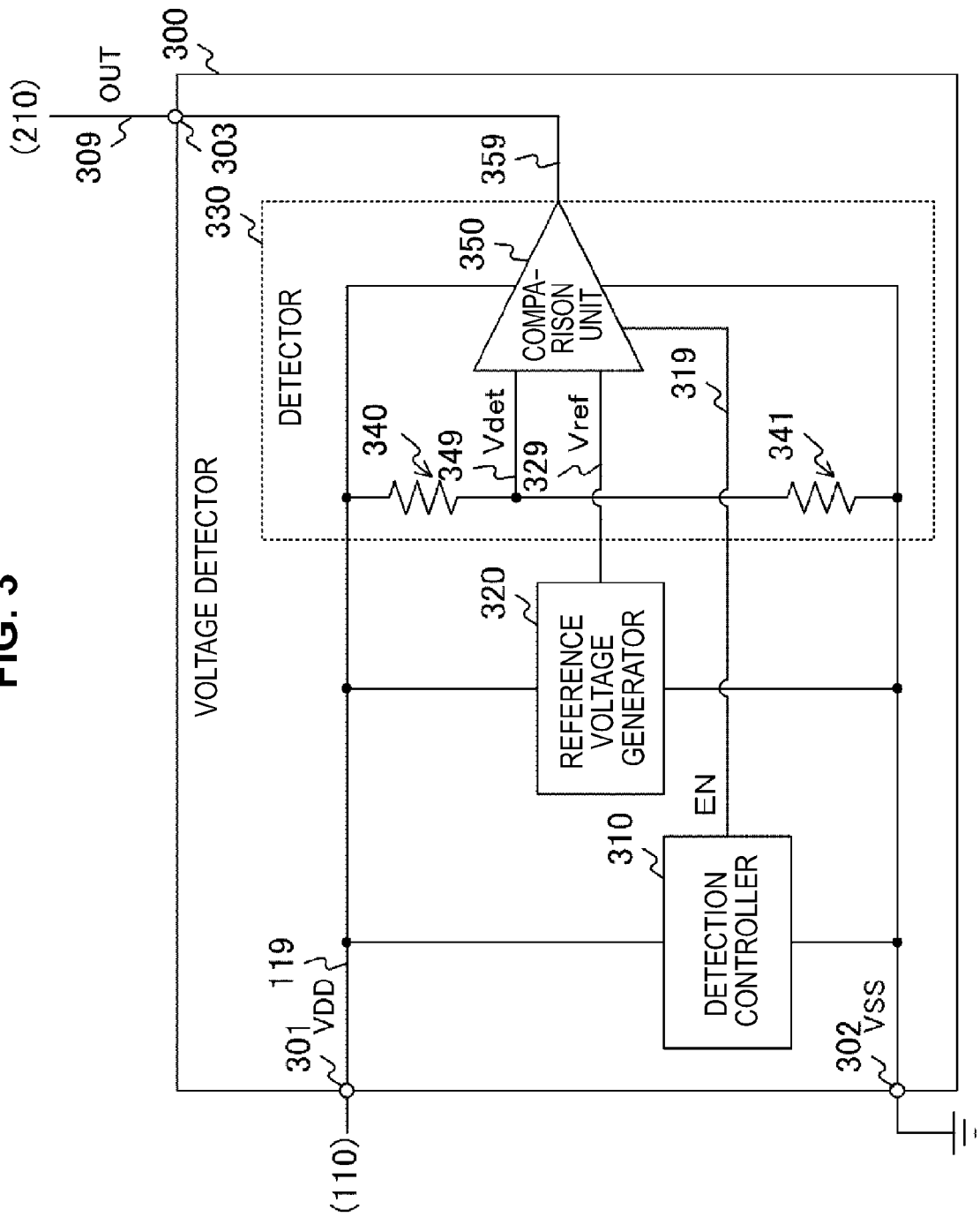
FIG. 3 is a block diagram showing a configuration example of a voltage detector according to the first embodiment.

FIG. 3 is a block diagram showing a configuration example of the voltage detector 300 according to the first embodiment. The voltage detector 300 includes a power supply terminal 301, a grounding terminal 302, an output terminal 303, a detection controller 310, a reference voltage generator 320, and a detector 330. The detector 330 includes a resistor 340, a resistor 341, and a comparison unit 350.

The power supply terminal 301 is a terminal connected to the main power supply unit 110 and to which the power supply voltage VDD is applied. The grounding terminal 302 is a terminal to which a ground voltage VSS is applied. The potential of the ground voltage VSS is assumed to be lower than, for example, the defined voltage Vdef. The output terminal 303 is a terminal connected to the power supply changeover switch 210.

The reference voltage generator 320 generates the constant reference voltage Vref when the power supply voltage VDD is higher than a threshold voltage Vth. The reference voltage generator 320 supplies the reference voltage Vref to the detector 330 via a signal line 329.

The detection controller 310 controls the detector 330. The detection controller 310 generates a control signal EN that enables a detection operation of the detector 330 when the power supply voltage VDD exceeds a voltage that is higher than the threshold voltage Vth by a predetermined potential $V_{diff}$. When the power supply voltage VDD is equal to Vth+$V_{diff}$ or lower, the detection controller 310 generates a control signal EN that disables the detection operation. The detection controller 310 supplies the control signal EN to the detector 330 via the signal line 319. For example, a low level is set to the control signal EN to enable the detection operation and a high level is set to the control signal EN to disable the detection operation.

When the power supply voltage VDD is higher than Vth+$V_{diff}$, the detector 330 detects whether the power supply voltage VDD is higher than the defined voltage Vdef based on the reference voltage $V_{ref}$. The detector 330 includes the resistor 340, the resistor 341, and the comparison unit 350.

The resistor 340 and the resistor 341 are connected in series between the power supply terminal 301 and the grounding terminal 302. The connecting point of the resistor 340 and the resistor 341 is connected to an input terminal of the comparison unit 350 via a signal line 349. A detection target voltage Vdet, which is the voltage of the connecting point, is a voltage produced by dividing the power supply voltage VDD in the ratio of a resistance value Ru of the resistor 340 to a resistance value Rd of the resistor 341. More specifically, the detection target voltage Vdet is determined by the following formula:

$$Vdet = Ru \times VDD/(Ru+Rd) \qquad \text{Formula 1}$$

In the above formula, the unit of the power supply voltage VDD and the detection target voltage Vdef is, for example, the volt (V) and the unit of the resistance values Ru, Rd is, for example, the ohm (Ω).

Each of the resistance values Ru, Rd is assumed to be set to a value satisfying the following formula:

$$Vref = Ru \times Vdef/(Ru+Rd) \qquad \text{Formula 2}$$

In the above formula, the unit of the defined voltage Vdef and the reference voltage Vref is, for example, the volt (V).

A circuit including the resistors 340, 341 is an example of a voltage dividing unit described in claims.

The comparison unit 350 compares the voltage (Vdet) produced by dividing the power supply voltage VDD and the reference voltage Vref. From the formulas 1 and 2, the comparison result of comparing the detection target voltage Vdet and the reference voltage Vref corresponds to a result of comparing the power supply voltage VDD and the defined voltage Vdef. The comparison unit 350 outputs a comparison result of the detection target voltage Vdet and the reference voltage Vref to the power supply changeover switch 210 as the detection result OUT.

By dividing the power supply voltage VDD and comparing with the reference voltage Vref in this manner, the defined voltage Vdef can easily be changed only by changing the voltage division ratio without changing the reference voltage Vref.

[Configuration Example of the Reference Voltage Generator]

Figure 4:
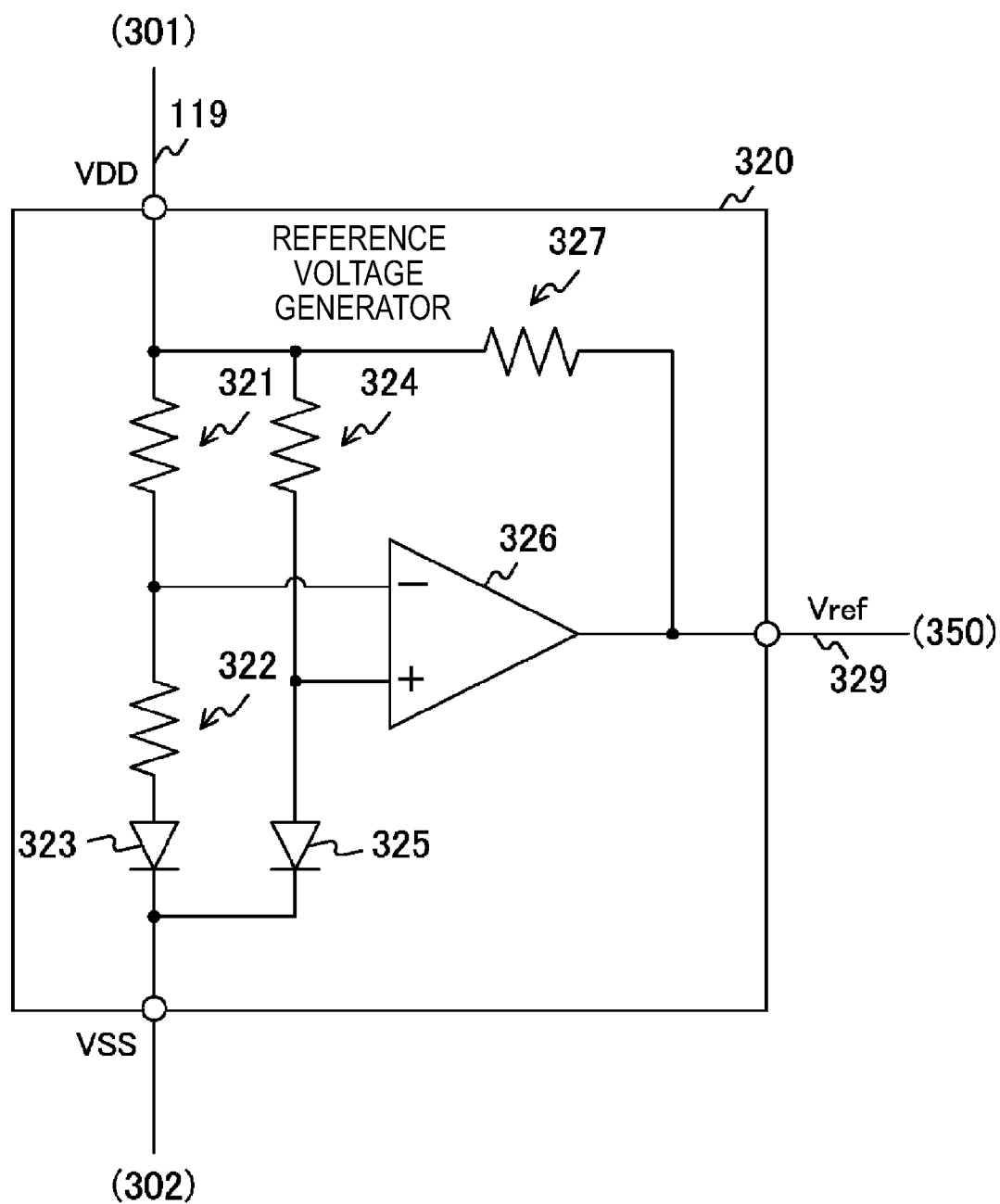
FIG. 4 is a circuit diagram showing a configuration example of a reference voltage generator according to the first embodiment.

FIG. 4 is a block diagram showing a configuration example of the reference voltage generator 320 according to the first embodiment. The reference voltage generator 320 includes resistors 321, 322, 324, 327, diodes 323, 325, and an operational amplifier 326.

The resistor 321, the resistor 322, and the diode 323 are connected in series between the power supply terminal 301 and the grounding terminal 302. The resistor 324 and the diode 325 are connected in series between the power supply voltage VDD and the grounding voltage VSS.

The diodes 323, 325 are connected in the forward direction. In other words, the anodes of the diodes 323, 325 are connected to the side of the power supply terminal 301 and the cathodes thereof are connected to the grounding terminal 302. The forward voltage of these diodes and V-I characteristics are assumed to be the same.

Then, a circuit including the resistor 321, the resistor 322, and the diode 323 and a circuit including the resistor 324 and the diode 325 are connected in parallel between the power supply terminal 301 and the grounding terminal 302. Also, one end of the resistor 327 is connected to the output terminal of the operational amplifier 326 and the other end is connected to a terminal on the power supply side of the resistors 321, 324.

The connecting point of the resistor 321 and the resistor 322 is connected to an inverting input terminal (−) of the operational amplifier 326 and the connecting point of the resistor 324 and the diode 325 is connected to a non-inverting input terminal (+) of the operational amplifier 326.

The operational amplifier 326 amplifies a potential difference between the inverting input terminal (−) and the non-inverting input terminal (+). The output terminal of the operational amplifier 326 is connected to the resistor 327 and the comparison unit 350. Through this connection, an output current from the operational amplifier 326 is fed back to the resistors 321, 324 via the resistor 327.

If the power supply voltage VDD is higher than the forward voltage of the diodes 323, 325, a current in the forward direction flows to these diodes. Then, with an increasing current, a voltage $V_+$ of the inverting input terminal (−) and a voltage $V_-$ of the non-inverting input terminal (+) increase. However, the amount of change of the voltage $V_+$ is small when compared with an increase in current. On the other hand, the amount of change of the voltage $V_-$ is relatively large due to the resistor 322.

Because the operational amplifier 326 feeds back the output current, when the power supply voltage VDD is higher than the predetermined threshold voltage Vth, the voltage $V_+$ of the inverting input terminal (−) and the voltage $V_-$ of the non-inverting input terminal (+) become equal. When the voltage $V_+$ of the inverting input terminal (−) and the voltage $V_-$ of the non-inverting input terminal (+) are the same, the voltage of the output terminal of the operational amplifier 326 is the reference voltage Vref represented by Formula 3 shown below:

$$V\text{ref} = Vf + K \times V_T \qquad \text{Formula 3}$$

In the above formula, K is a constant represented by Formula 4 shown below: $V_T$ is a thermal voltage represented by Formula 5 shown below and the unit thereof is, for example, the volt (V).

$$K = R_2/R_3 \times \ln(R_2/R_1) \qquad \text{Formula 4}$$

$$V_T = k \times T/q \qquad \text{Formula 5}$$

In Formula 4, $R_1$ is the resistance value of the resistor 324, $R_2$ is the resistance value of the resistor 321, and $R_3$ is the resistance value of the resistor 322. The unit of these $R_1$, $R_2$, and $R_3$ is, for example, the ohm (Ω).

In Formula 5, k is the Boltzmann constant and is about $1.38 \times 10^{-23}$ (J/K). T is the absolute temperature and the unit thereof is, for example, Kelvin (K). q is the elementary electric charge and is about $1.60 \times 10^{-19}$ (C).

Formula 3 shows that the reference voltage Vref is a constant voltage decided by characteristics of the diode 323 and values of resistance. The reference voltage Vref is a value dependent on the band gap voltage of a semiconductor. A circuit that generates a constant reference voltage dependent on the band gap voltage as described above is called a band gap reference circuit.

The reference voltage generator 320 is configured to include a band gap reference circuit, but is not limited to the above configuration if the constant reference voltage Vref can be generated. For example, the reference voltage generator 320 may be configured to include a regulator that generates the reference voltage Vref when the power supply voltage VDD is higher than the threshold voltage Vth.

FIG. 5 shows graphs showing V-I characteristics of the diode 323 according to the first embodiment and the relationship between the power supply voltage and the reference voltage. FIG. 5a is a graph showing V-I characteristics of the diode 323. In a of FIG. 5, the vertical axis represents a current I flowing to the diode 323 and the horizontal axis represents a voltage V applied to the diode 323. A positive voltage V represents a forward bias and a negative voltage V represents a backward bias. As shown in a of FIG. 5, when the voltage V is higher than the forward voltage (for example, 0.80 V), the current I in the forward direction flows to the diode 323. V-I characteristics of the diode 325 are the same as those of the diode 323.

FIG. 5b is a graph showing an example of the relationship between the power supply voltage VDD and the reference voltage Vref. In b of FIG. 5, the vertical axis represents the reference voltage Vref and the horizontal axis represents the power supply voltage VDD. If, as shown in b of FIG. 5, the power supply voltage VDD is gradually raised, the reference voltage Vref starts to rise when the power supply voltage VDD becomes higher than the forward voltage of the diode 323. Then, when the power supply voltage VDD exceeds the threshold voltage Vth (for example, 1.00 V), which is higher than the forward voltage, the reference voltage Vref is a constant voltage (for example, 1.20 V) regardless of the power supply voltage VDD.

[Configuration Example of the Detection Controller]

Figure 6:
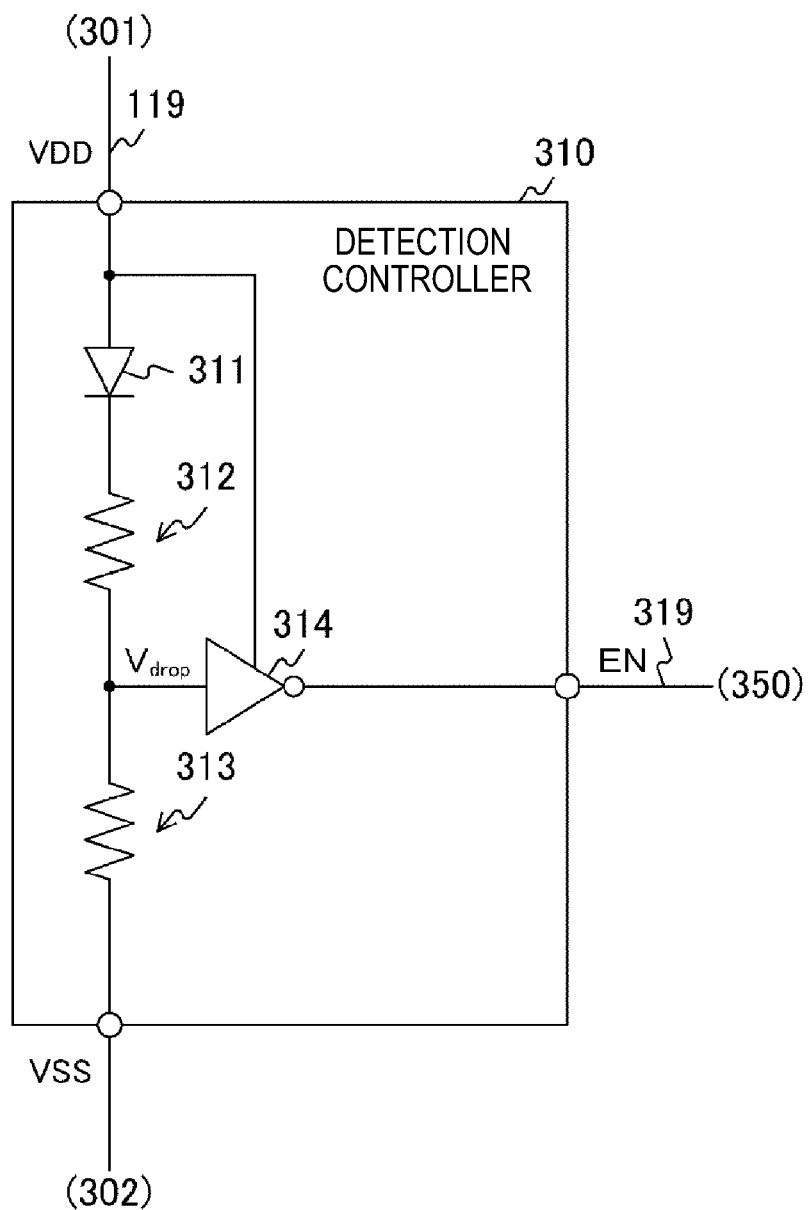
FIG. 6 is a circuit diagram showing a configuration example of a detection controller according to the first embodiment.

FIG. 6 is a circuit diagram showing a configuration example of the detection controller 310 according to the first embodiment. The detection controller 310 includes a diode 311, resistors 312, 313, and an inverter 314.

The anode of the diode 311 is connected to the power supply terminal 301 and the cathode thereof is connected to the resistor 312. The resistors 312, 313 are connected in series to the diode 311 and the connecting point of the resistors 312, 313 is connected to an input terminal of the inverter 314.

The forward voltage of the diode 311 is desirably the same as that of the diode 323 inside the reference voltage generator 320. Even if the forward voltage of the diode 311 is not the same as that of the diode 323 inside the reference voltage generator 320, the forward voltage is assumed to be equal to the threshold voltage Vth or lower. Each resistance value of the resistors 312, 313 is adjusted so that the voltage drop at the connecting point thereof is equal to the threshold voltage Vth.

The inverter 314 inverts an input signal. When an input voltage $V_{drop}$ at the connecting point of the resistors 312, 313 is higher than a predetermined potential $V_{diff}$, the inverter 314 supplies a low-level (enable) control signal EN to the comparison unit 350. On the other hand, when the input voltage $V_{drop}$ is equal to the predetermined potential $V_{diff}$ or lower, the inverter 314 supplies a high-level (disable) control signal EN to the comparison unit 350. The inverter 314 is an example of a control signal generator described in claims.

The input voltage $V_{drop}$ is produced by lowering the power supply voltage VDD by the threshold voltage Vth and thus, when the input voltage $V_{drop}$ is higher than the predetermined potential $V_{diff}$, that is, the power supply voltage VDD is higher than Vth+$V_{diff}$, the enable control signal EN is generated.

The detection controller 310 can be realized by adding only one branch current from the main power supply and so its implementation is easy. The detection controller 310 has a simple configuration and thus, power consumption of the detection controller 310 is small. In addition, the detection controller 310 does not necessitate a current from a standby power supply such as a secondary battery and thus, power consumption of the standby power supply can be curbed.

FIG. 7 shows graphs showing an example of the relationship between the input voltage $V_{drop}$, the control signal EN, and the power supply voltage VDD according to the first embodiment. FIG. 7a is a graph showing the relationship between the input voltage $V_{drop}$ and the power supply voltage VDD. In a of FIG. 7, the vertical axis represents the input voltage $V_{drop}$ and the horizontal axis represents the power supply voltage VDD. As shown in a of FIG. 7, when the power supply voltage VDD is equal to the forward voltage (for example, 0.80 V) or lower of a diode, the input voltage $V_{drop}$ becomes a low level. When the power supply voltage VDD is higher than the forward voltage of a diode, the input voltage $V_{drop}$ increases with an increasing power supply voltage VDD. Then, when the power supply voltage VDD is Vth+$V_{diff}$, the input voltage $V_{drop}$ becomes an inverted threshold voltage Vinv. If the input voltage $V_{drop}$ is higher than the inverted threshold voltage Vinv, the inverter 314 supplies a low-level (enable) control signal EN and otherwise, the inverter 314 supplies the control signal EN of a level in accordance with the power supply voltage VDD to the comparison unit 350.

FIG. 7b is a graph showing an example of the relationship between the control signal EN and the power supply voltage VDD. In b of FIG. 7, the vertical axis represents the control signal EN and the horizontal axis represents the power supply voltage VDD. When the power supply voltage VDD is higher than Vth+$V_{diff}$, the input voltage $V_{drop}$ is higher than the inverted threshold voltage Vinv and thus, the inverter 314 generates a low-level (enable) control signal EN. On the other hand, when the power supply voltage VDD is lower than or equal to Vth+$V_{diff}$, the inverter 314 generates the control signal EN of a level in accordance with the power supply voltage VDD.

When the power supply voltage VDD is higher than a voltage $V_L$, the control signal EN is handled as a high-level (disable) signal by the subsequent comparison unit 350. On the other hand, when power supply voltage VDD is equal to the voltage $V_L$ or lower, the control signal EN is handled as a low-level (enable) signal. When the power supply voltage VDD is equal to the voltage $V_L$ or lower, the detection function of the comparison unit 350 is exceptionally disabled even if the control signal EN is a low level. A configuration that disables the detection function when the power supply voltage VDD is equal to the voltage $V_L$ or lower will be described later with reference to FIG. 9.

[Configuration Example of the Comparison Unit]

Figure 8:
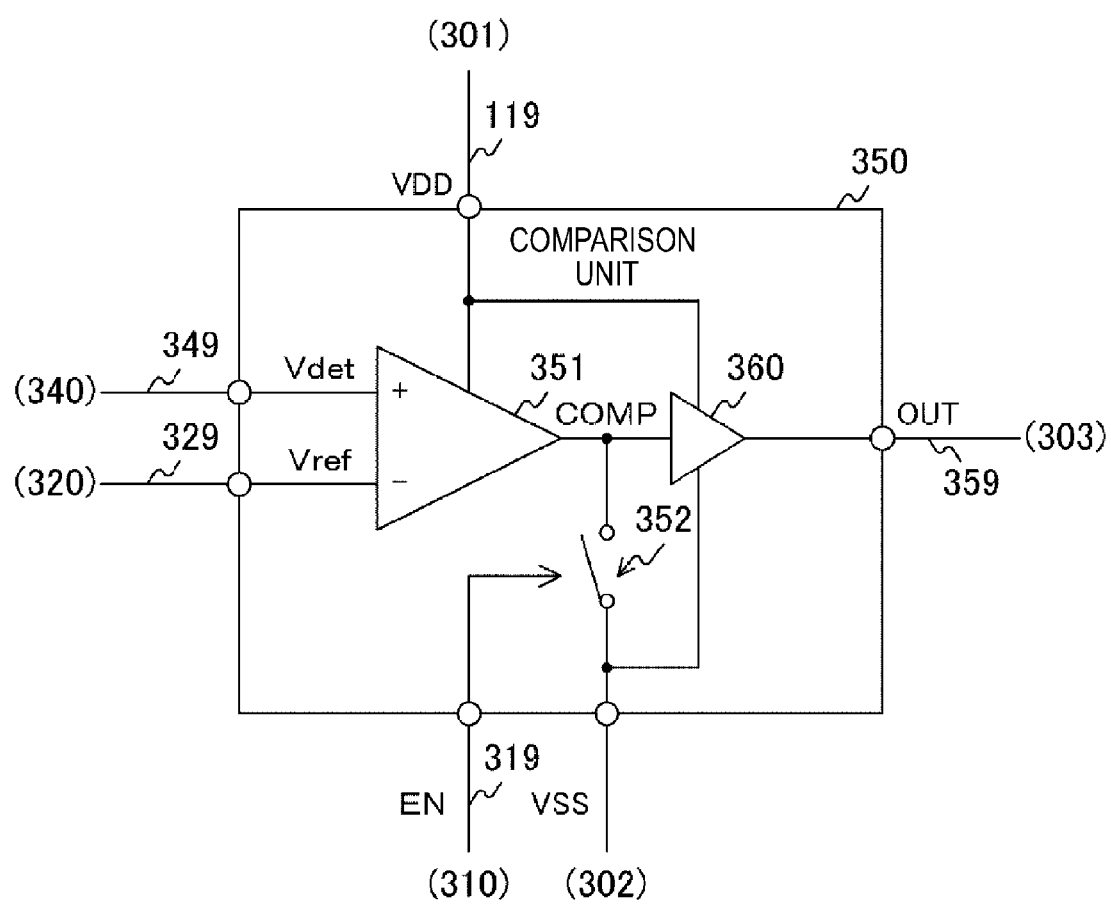
FIG. 8 is a circuit diagram showing a configuration example of a comparison unit according to the first embodiment.

FIG. 8 is a circuit diagram showing a configuration example of the comparison unit 350 according to the first embodiment. The comparison unit 350 includes a comparator 351, a control switch 352, and a buffer 360.

The comparator 351 compares the detection target voltage Vdet and the reference voltage Vref. The detection target voltage Vdet is input into the non-inverting input terminal (+) of the comparator 351 and the reference voltage Vref is input into the inverting input terminal (−). The output terminal of the comparator 351 is connected to input terminals of the control switch 352 and the buffer 360.

The comparator 351 outputs a comparison result COMP based on Formula 6 shown below:

$$\text{COMP} = VDD \times sgn(V_+ - V_-) \quad \text{Formula 6}$$

In the above formula, $V_+$ is the voltage of the non-inverting input terminal (+), that is, the detection target voltage Vdet. $V_-$ is the voltage of the inverting input terminal (−), that is, the reference voltage Vref. sgn(A−B) is a function that returns "1" when A>B and otherwise, returns "0".

From Formula 6, when the detection target voltage Vdet is higher than the reference voltage Vref, the detection result OUT of the power supply voltage VDD (that is, of a high level) is output and otherwise, the comparison result COMP of a low level is output.

The control switch 352 opens/closes a line according to the control signal EN. The control switch 352 has two terminals, one of which is connected to the comparator 351 and the buffer 360 and the other is connected to the grounding terminal 302. The control switch 352 shifts to a closed state when the control signal EN is a high level (disable) and shifts to an open state when the control signal EN is a low level (enable).

The buffer 360 outputs the detection result OUT according to the control of the control switch 352. The buffer 360 is connected to the power supply terminal 301 and the grounding terminal 302. The input terminal of the buffer 360 is connected to the comparator 351 and the control switch 352 and the output terminal thereof is connected to the output terminal 303.

When the control signal EN is in an enable state, that is, the control switch 352 is in an open state, the buffer 360 outputs the comparison result COMP directly as the detection result OUT. On the other hand, when the control signal EN is in a disable state, that is, the control switch 352 is in a closed state, the potential of the input terminal of the buffer 360 becomes equal to the ground voltage VSS. Thus, the buffer 360 outputs a low-level signal as the detection result OUT regardless of the comparison result COMP by the comparator 351.

[Configuration Example of the Buffer]

Figure 9:
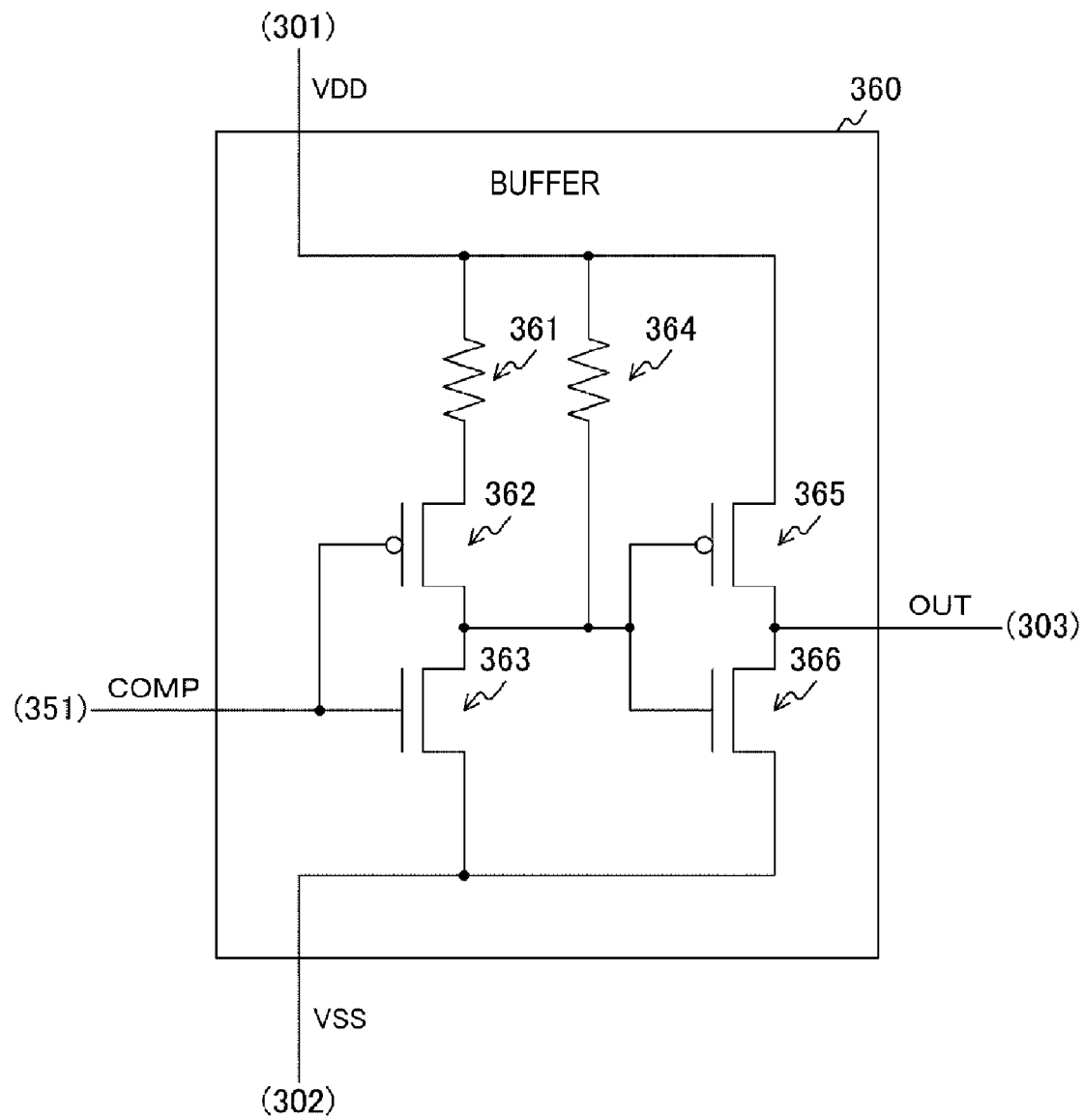
FIG. 9 is a circuit diagram showing a configuration example of a buffer according to the first embodiment.

FIG. 9 is a circuit diagram showing a configuration example of the buffer 360 according to the first embodiment. The buffer 360 includes resistors 361, 364 and transistors 362, 363, 365, 366. As the transistors 362, 365, for example, a p-type MOS (metal-oxide-semiconductor) transistor is used. Also as the transistors 363, 366, for example, an n-type MOS transistor is used.

One end of the resistor 361 is connected to the power supply terminal 301 and the other end thereof is connected to the source of the transistor 362. The transistors 362, 363 are connected in series between the resistor 361 and the grounding terminal 302 and the comparison result COMP is input into the gates thereof. The connecting point of the transistors 362, 363 is connected to the resistor 364 and the gates of the transistors 365, 366.

One end of the resistor 364 is connected to the power supply terminal 301 and the other end thereof is connected to the connecting point of the transistors 362, 363 and the gates of the transistors 365, 366. The transistors 365, 366 are connected in series between the power supply terminal 301 and the grounding terminal 302. The connecting point of the transistors 365, 366 is connected to the output terminal 303.

Due to the above configuration, the transistors 362, 363 invert the comparison result COMP and the transistors 365, 366 further invert the inverted comparison result COMP to output as the detection result OUT. However, when the power supply voltage VDD is equal to the voltage $V_L$ or lower, the voltage (detection result OUT) of the connecting point of the transistors 365, 366 becomes a very small value due to the resistor 364. Thus, the buffer 360 outputs a low-level detection result OUT regardless of the value of the comparison result COMP.

FIG. 10 is a diagram showing an example of the operation of the comparison unit 350 according to the first embodiment. When the power supply voltage VDD is equal to the threshold voltage Vth or lower, the detection controller 310 generates a disable control signal EN. In this case, the comparison unit 350 disables the detection operation according to the control signal EN and outputs a low-level detection result OUT indicating that the power supply voltage VDD is equal to the defined voltage Vdef or lower.

When the power supply voltage VDD is higher than the threshold voltage Vth and is equal to Vth+$V_{diff}$ or lower, the detection controller 310 generates the disable control signal EN and the reference voltage generator 320 generates the constant reference voltage Vref. Also in this case, the comparison unit 350 outputs a low-level detection result OUT according to the control signal EN.

When the power supply voltage VDD is higher than Vth+$V_{diff}$ and is equal to the defined voltage Vdef or lower, the detection controller 310 generates the enable control signal EN and the reference voltage generator 320 generates the constant reference voltage Vref. In this case, the comparison unit 350 enables the detection operation according to the control signal EN and outputs a low-level detection result OUT indicating that the power supply voltage VDD is equal to the defined voltage Vdef or lower.

When the power supply voltage VDD is higher than the defined voltage Vdef, the detection controller 310 generates the enable control signal EN and the reference voltage generator 320 generates the constant reference voltage Vref. In this case, the comparison unit 350 enables the detection operation according to the control signal EN and outputs a high-level detection result OUT indicating that the power supply voltage VDD is higher than the defined voltage Vdef.

Thus, the reference voltage generator 320 generates the constant reference voltage Vref when the power supply voltage VDD is higher than the threshold voltage Vth. On the other hand, when the power supply voltage VDD is higher than Vth+$V_{diff}$, the detection controller 310 generates the enable control signal EN. Therefore, the constant reference voltage Vref is always generated at the power supply voltage VDD (Vth+$V_{diff}$) at which the detection operation of the detector 330 is enabled. Conversely, the detection operation of the detector 330 is set to disabling at the power supply voltage VDD Vth) at which the constant reference voltage Vref is not generated. Therefore, the correct detection result OUT is output even if the power supply voltage VDD is equal to the threshold voltage Vth or lower.

Figure 11:
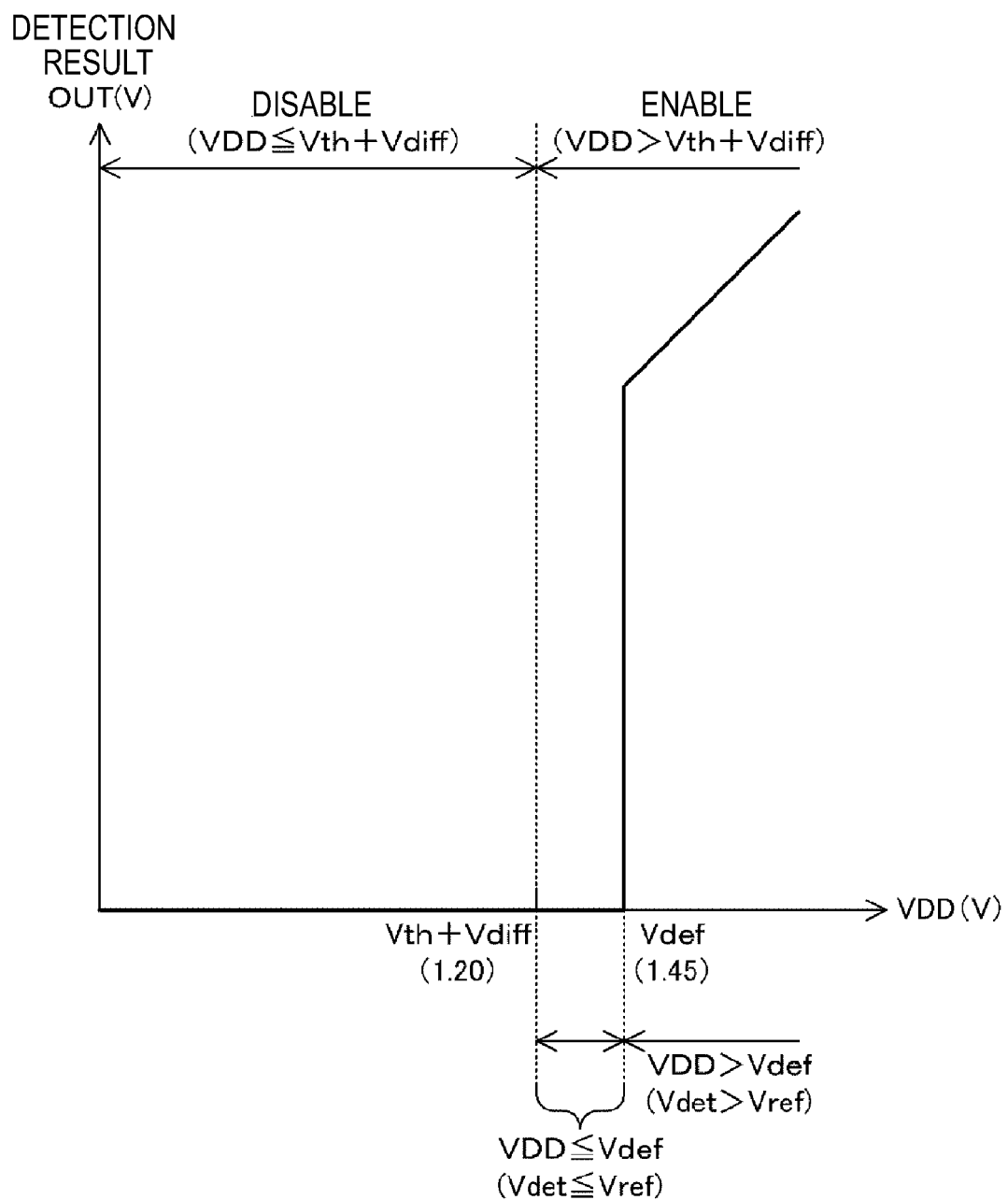
FIG. 11 shows a graph showing an example of the relationship between a detection result and the power supply voltage according to the first embodiment.

FIG. 11 shows a graph showing an example of the relationship between the detection result OUT and the power supply voltage VDD according to the first embodiment. The vertical axis in FIG. 11 represents the detection result OUT and the horizontal axis represents the power supply voltage VDD. When the power supply voltage VDD is equal to Vth+$V_{diff}$ or lower, the disable detection signal EN is input into the detector 330. In this case, the detector 330 outputs a low-level detection result OUT On the other hand, when the power supply voltage VDD is higher than Vth+$V_{diff}$, the enable control signal EN and the constant reference voltage Vref are input into the detector 330. In this case, the detector 330 compares the power supply voltage VDD and the defined voltage Vdef based on the reference voltage Vref. If the power supply voltage VDD is equal to the defined voltage Vdef or lower, the detector 330 outputs a low-level detection result OUT. If the power supply voltage VDD is higher than the defined voltage Vdef, the detector 330 outputs a high-level detection result OUT.

[Operation Example of the Electronic Device]

Figure 12:
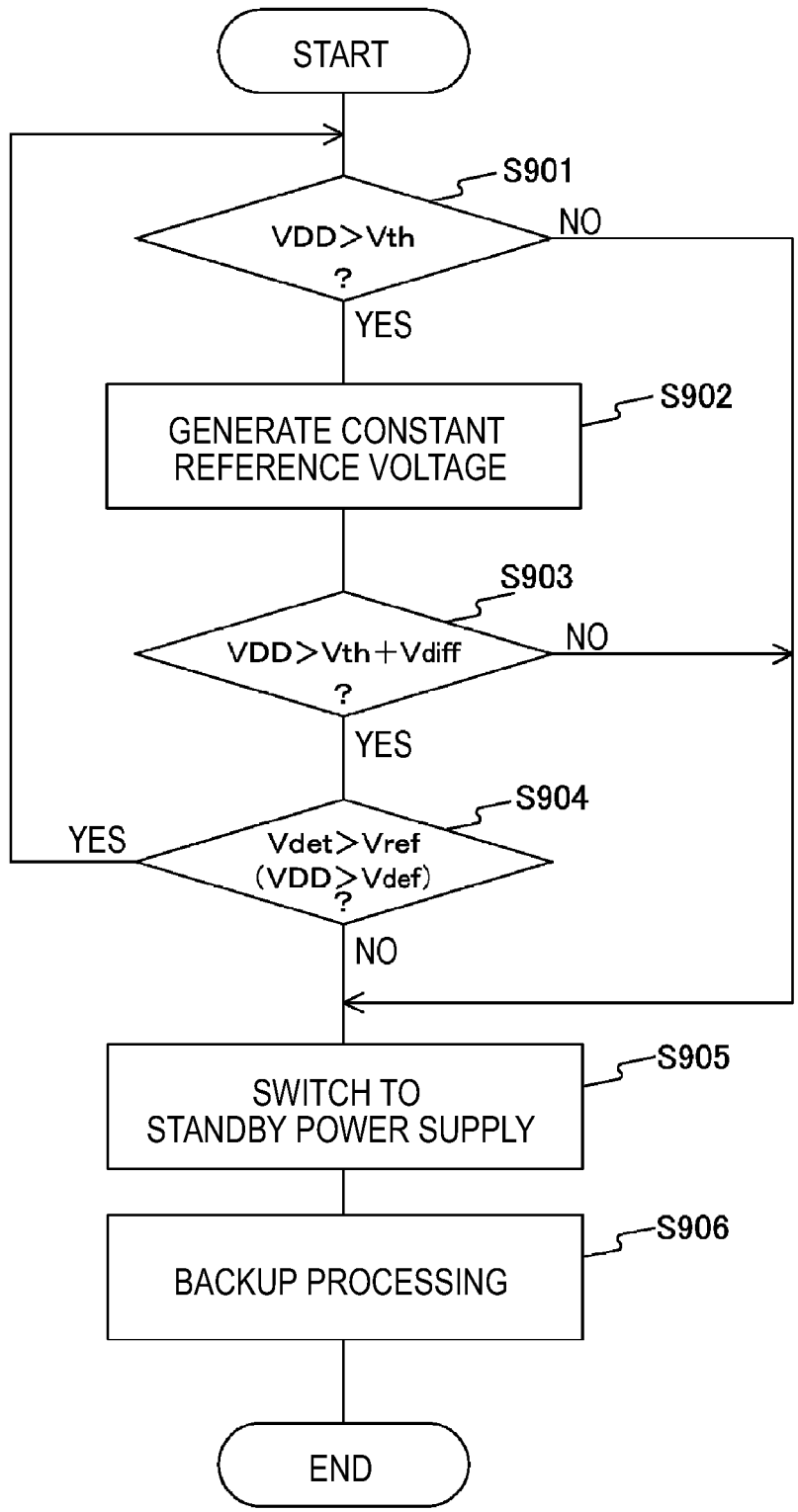
FIG. 12 shows a flow chart showing an example of the operation of the electronic device according to the first embodiment.

FIG. 12 shows a flow chart showing an example of the operation of the electronic device 100 according to the first embodiment. The operation is started when, for example, power is supplied to the electronic device 100 from the main power supply. The electronic device 100 determines whether the power supply voltage VDD of the main power supply is higher than the threshold voltage Vth (step S901). If the power supply voltage VDD is higher than the threshold voltage Vth (step S901: Yes), the reference voltage generator 320 inside the electronic device 100 generates the constant reference voltage Vref (step S902).

After step S902, the detection controller 310 inside the electronic device 100 determines whether the power supply voltage VDD is higher than Vth+$V_{diff}$ (step S903). If the power supply voltage VDD is higher than Vth+$V_{diff}$ (step S903: Yes), the detection controller 310 outputs the enable control signal EN. The detection operation of the detector 330 inside the electronic device 100 is enabled by the enable control signal EN and the detector 330 determines whether the detection target voltage Vdet is higher than the reference voltage Vref, that is, whether the power supply voltage VDD is higher than the defined voltage Vdef (step S904). If the detection target voltage Vdet is higher than the reference voltage Vref (step S904: Yes), the electronic device 100 returns to step S901.

If the power supply voltage VDD is equal to Vth+$V_{diff}$ or lower (step S903: No) or the power supply voltage VDD is equal to the threshold voltage Vth or lower (step S901: No), the detection controller 310 outputs the disable control signal EN. The detection operation of the detector 330 inside the electronic device 100 is disabled by the disable control signal EN and the detection result is a low level. Also if the detection target voltage Vdet is equal to the reference voltage Vref or lower (step S904: No), the detection result is a low level. Based on the detection result of a low level, the power supply changeover switch 210 switches the supply source of the power supply from the main power supply to the standby power supply (step S905). The electronic device 100 also performs predetermined backup processing (step S906). After step S906, the electronic device 100 terminates its operation.

According to the first embodiment of the present technology, as described above, when a power supply voltage exceeds a voltage that is higher than a threshold voltage by a predetermined potential, an electronic device detects whether the power supply voltage is higher than a defined voltage based on a reference voltage and therefore, the power supply voltage that is higher than the defined voltage can correctly be detected. Accordingly, the device can be prevented from malfunctioning at a low voltage equal to the defined voltage or lower.

2. Second Embodiment

Configuration Example of the Detection Controller

In the first embodiment, the detection controller 310 causes a voltage drop of the power supply voltage VDD by a diode, but instead of the diode, the power supply voltage may be caused to drop by using a transistor. The detection controller 310 according to the second embodiment is different from the first embodiment in that instead of a diode, a transistor is used to cause the power supply voltage to drop.

Figure 13:
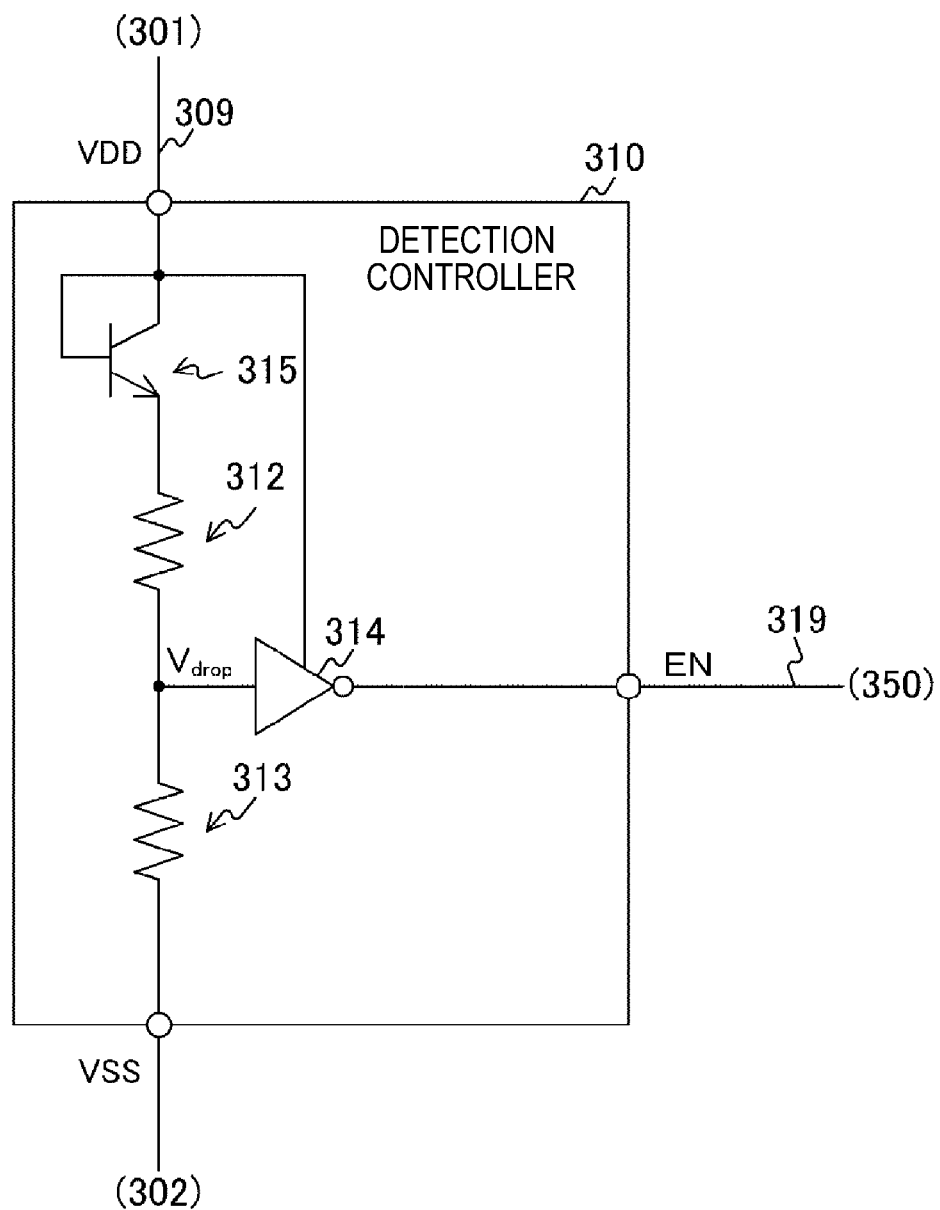
FIG. 13 is a circuit diagram showing a configuration example of the detection controller according to a second embodiment.

FIG. 13 is a circuit diagram showing a configuration example of the detection controller 310 according to the second embodiment. The detection controller 310 according to the second embodiment is different from the first embodiment in that instead of the diode 311, a transistor 315 is included. As the transistor 315, for example, an NPN-type bipolar transistor is used.

The base and collector of the transistor 315 are connected to the power supply terminal 301 and the emitter thereof is connected to the resistor 312. In other words, the transistor 315 is connected like a diode. The inter-terminal voltage drop between the emitter and base of the transistor 315 is desirably the same as the forward voltage of the diode 323 inside the reference voltage generator 320. Incidentally, the detection controller 310 may also use a device other than the diode and transistor to cause the power supply voltage VDD to drop.

According to the second embodiment, as described above, the electronic device 100 can cause the power supply voltage to drop by using a transistor, instead of a diode.

The above-described embodiments are examples for embodying the present technology, and matters in the embodiments each have a corresponding relationship with matters specific to the present disclosure in the claims. Likewise, the matters in the embodiments and the matters specific to the present disclosure in the claims denoted by the same names have a corresponding relationship with each other. However, the present technology is not limited to the embodiments, and various modifications of the embodiments may be embodied in the scope of the present technology without departing from the spirit of the present technology.

In addition, the process procedures in the above-described embodiments may be grasped as a method including the series of procedures, and may be grasped as a program for enabling a computer to execute the series of procedures or a recording medium storing the program thereon. The recording medium may use, for example, a CD (Compact Disc), an MD (Mini Disc), a DVD (Digital Versatile Disk), a memory card, a Blu-ray Disc (registered trademark), or the like. Additionally, the present technology may also be configured as below.

(1) A voltage detector including:
a reference voltage generator that generates a constant reference voltage when a power supply voltage is higher than a predetermined threshold voltage; and a detector that, when the power supply voltage exceeds a voltage that is higher than the threshold voltage by a predetermined potential, detects whether the power supply voltage is higher than a defined voltage based on the reference voltage and outputs a detection result.

(2) The voltage detector according to (1), further including:
a detection controller that, when the power supply voltage exceeds the voltage that is higher than the threshold voltage by the predetermined potential, supplies a control signal to enable a detection operation of the detector to the detector,
wherein, when the detection operation is enabled by the control signal, the detector detects whether the power supply voltage is higher than the defined voltage based on the reference voltage and outputs the detection result.

(3) The voltage detector according to (2),
wherein the detector includes
a voltage dividing unit that divides the power supply voltage in accordance with a ratio of the reference voltage to the defined voltage, and
a comparison unit that, when the detection operation is enabled by the control signal, compares the divided power supply voltage and the reference voltage and outputs a result of the comparison as the detection result.

(4) The voltage detector according to (2) or (3),
wherein the detection controller includes
a voltage dropping unit that causes the power supply voltage to drop until a potential difference between the power supply voltage before being caused to drop and the power supply voltage after being caused to drop falls to the threshold voltage, and
a control signal generator that, when the power supply voltage caused to drop is higher than the predetermined potential, outputs the control signal to enable the detection operation.

(5) The voltage detector according to (4),
wherein the voltage dropping unit causes the power supply voltage to drop by a diode and impedance connected in series to the power supply voltage.

(6) The voltage detector according to (4) or (5),
wherein the voltage dropping unit causes the power supply voltage to drop by a transistor and impedance connected in series to the power supply voltage.

(7) An electronic device including:
a reference voltage generator that generates a constant reference voltage when a power supply voltage is higher than a predetermined threshold voltage;
a detector that, when the power supply voltage exceeds a voltage that is higher than the threshold voltage by a predetermined potential, detects whether the power supply voltage is higher than a defined voltage based on the reference voltage and outputs a detection result; and
a processing unit that performs predetermined processing based on the detection result.

(8) A control method performed by a voltage detector, the method including:
generating a constant reference voltage when a power supply voltage is higher than a predetermined threshold voltage by a reference voltage generator; and
when the power supply voltage exceeds a voltage that is higher than the threshold voltage by a predetermined potential, detecting whether the power supply voltage is higher than a defined voltage based on the reference voltage and outputting a detection result by a detector.

What is claimed is:
1. A voltage detector comprising:
a reference voltage generator that generates a constant reference voltage when a power supply voltage is higher than a predetermined threshold voltage; and a detector that, when the power supply voltage exceeds a voltage that is higher than the threshold voltage by a predetermined potential, detects whether the power supply voltage is higher than a defined voltage based on the reference voltage and outputs a detection result.

2. The voltage detector according to claim 1, further comprising:

a detection controller that, when the power supply voltage exceeds the voltage that is higher than the threshold voltage by the predetermined potential, supplies a control signal to enable a detection operation of the detector to the detector, wherein, when the detection operation is enabled by the control signal, the detector detects whether the power supply voltage is higher than the defined voltage based on the reference voltage and outputs the detection result.

3. The voltage detector according to claim 2, wherein the detector includes a voltage dividing unit that divides the power supply voltage in accordance with a ratio of the reference voltage to the defined voltage, and a comparison unit that, when the detection operation is enabled by the control signal, compares the divided power supply voltage and the reference voltage and outputs a result of the comparison as the detection result.

4. The voltage detector according to claim 2, wherein the detection controller includes a voltage dropping unit that causes the power supply voltage to drop until a potential difference between the power supply voltage before being caused to drop and the power supply voltage after being caused to drop falls to the threshold voltage, and a control signal generator that, when the power supply voltage caused to drop is higher than the predetermined potential, outputs the control signal to enable the detection operation.

5. The voltage detector according to claim 4, wherein the voltage dropping unit causes the power supply voltage to drop by a diode and impedance connected in series to the power supply voltage.

6. The voltage detector according to claim 4, wherein the voltage dropping unit causes the power supply voltage to drop by a transistor and impedance connected in series to the power supply voltage.

7. An electronic device comprising:

a reference voltage generator that generates a constant reference voltage when a power supply voltage is higher than a predetermined threshold voltage;

a detector that, when the power supply voltage exceeds a voltage that is higher than the threshold voltage by a predetermined potential, detects whether the power supply voltage is higher than a defined voltage based on the reference voltage and outputs a detection result; and a processing unit that performs predetermined processing based on the detection result.

8. A control method performed by a voltage detector, the method comprising:

generating a constant reference voltage when a power supply voltage is higher than a predetermined threshold voltage by a reference voltage generator; and when the power supply voltage exceeds a voltage that is higher than the threshold voltage by a predetermined potential, detecting whether the power supply voltage is higher than a defined voltage based on the reference voltage and outputting a detection result by a detector.

* * * * *